United States Patent
Gerber (10) Patent No.: US 7,547,630 B2
(45) Date of Patent: Jun. 16, 2009

(54) METHOD FOR STACKING SEMICONDUCTOR CHIPS

(75) Inventor: Mark A. Gerber, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 78 days.

(21) Appl. No.: 11/861,934

(22) Filed: Sep. 26, 2007

(65) Prior Publication Data

US 2009/0079067 A1    Mar. 26, 2009

(51) Int. Cl.
*H01L 21/44* (2006.01)
*H01L 23/52* (2006.01)
*H01L 23/48* (2006.01)
*H01L 29/40* (2006.01)
*H01L 21/768* (2006.01)

(52) U.S. Cl. .................. 438/667; 438/668; 257/774; 257/773; 257/621; 257/686; 257/E23.174; 257/E23.597

(58) Field of Classification Search ............. 438/667, 438/668; 257/621, 686, 773, 774, E21.597, 257/E23.174
See application file for complete search history.

(56) References Cited

U.S. PATENT DOCUMENTS

| 6,608,371 B2 * | 8/2003 | Kurashima et al. | 257/686 |
| 6,703,689 B2 * | 3/2004 | Wada | 257/621 |
| 7,180,149 B2 * | 2/2007 | Yamamoto et al. | 257/434 |
| 7,335,972 B2 * | 2/2008 | Chanchani | 257/686 |

\* cited by examiner

*Primary Examiner*—Luan C Thai
(74) *Attorney, Agent, or Firm*—Yingsheng Tung; Wade J. Brady, III; Frederick J. Telecky, Jr.

(57) ABSTRACT

In a semiconductor system (100) including a chip (101) and a workpiece (102), the chip has metal-filled vias (140) positioned between contact pads (120) and the respective edges (110). In addition, seals against microcracks (150) and thermo-mechanical stress (151) are located between the vias and the active components, and sometimes also between the vias and the respective nearest edge. Workpiece (102) may be another semiconductor chip or a substrate; it has contact pads (170) matching the locations of the vias (140). The chip is vertically stacked on the workpiece so that each contact pad (170) is aligned and in electrical contact with the corresponding via (140).

26 Claims, 6 Drawing Sheets

METHOD FOR STACKING SEMICONDUCTOR CHIPS

FIELD OF THE INVENTION

The present invention is related in general to the field of semiconductor devices and processes and more specifically to the structure and fabrication method of vertically stacked and horizontally joined semiconductor chips.

DESCRIPTION OF THE RELATED ART

The long-term trend in semiconductor technology to double the functional complexity of its products every 18 months (Moore's "law") has several implicit consequences. First, the higher product complexity should largely be achieved by shrinking the feature sizes of the chip components while holding the package dimensions constant; preferably, even the packages should shrink. Second, the increased functional complexity should be paralleled by an equivalent increase in reliability of the product. Third, the cost per functional unit should drop with each generation of complexity so that the cost of the product with its doubled functionality would increase only slightly.

As for the challenges in semiconductor packaging, the major trends are efforts to shrink the package outline so that the package consumes less area and less height when it is mounted onto the circuit board, and to reach these goals with minimum cost (both material and manufacturing cost). Recently, another requirement was added to this list, namely the need to design packages so that stacking of chips and/or packages becomes an option to increase functional density and reduce device thickness. A successful strategy for stacking chips and packages shortens the time-to-market of innovative products, which utilize available chips of various capabilities (such as processors and memory chips) and does not have to wait for a redesign of chips.

The technology favored for stacking of semiconductor chips and packages is the flip-chip method. The wide application of flip-chip assembly is driven by several facts. First, the electrical performance of the semiconductor devices can be improved when the parasitic inductances correlated with conventional wire bonding interconnection techniques are reduced. Second, flip-chip assembly provides higher interconnection densities between chip and package than wire bonding. In particular, the absence of looped wires allows the reduction of package height (profile) in unison with thickness reductions of chips, leadframes, and encapsulations. Third, flip-chip assembly consumes less silicon "real estate" than wire bonding, and thus helps to conserve silicon area and reduce device cost. And fourth, the fabrication cost can be reduced, when concurrent gang-bonding techniques are employed rather than consecutive individual bonding steps.

The conventional fabrication process uses tin-based solder balls and their reflow characteristics as the standard method of ball bonding. The achievable bump pitch, however, is limited. For solder materials, bumps or balls are presently limited to about 160 µm pitch center to center. These limits severely restrict the number of connections that can be made on the available chip surface, and thus constrain the use of flip-chip techniques, when devices with relatively small area chips are to be contacted.

For silicon chips, efforts were undertaken to replace reflow-based interconnecting balls with gold attached to aluminum-topped bond pads by a modified wire ball technique. The gold bump provided by this technique provides a substantially finer bump pitch; 25 µm diameter is the lower value for devices in production presently.

The most recent advancement in stacking silicon chips is the proposal to replace electrical connections using conductive wires or layers by conductive vias extending through the thickness of the semiconductor chips. The preferred metal for filling vias is copper. Unfortunately, the coefficient of thermal expansion of copper, or of most other metals, is at least an order of magnitude higher than the coefficient for silicon; combined with the great number of vias needed, a serious thermo-mechanical stress problem for the active chip components may result.

SUMMARY OF THE INVENTION

Applicant recognizes the existing need to find a common approach for solving reliability problems caused by stress and microcracks, especially when originating at the periphery of semiconductor chips, and then combine this approach with the opportunity to use existing fully developed circuit designs for building innovative stacks of chips and substrates. These combination devices may exhibit, for instance, the characteristics of memory and processor components. Applicant further recognizes the need to create these devices and shrink the lateral and vertical dimensions of the final product.

This invention solves the problem by using "low impact" regions around the periphery of the chip to position metal-filled vias, preferably in linear or staggered arrays. These regions also contain the chip bond pads so that the vias can be electrically connected to the pads. At the same time, rows of one or more type of seals are employed to shield the active circuitry against microcracks originating from chip scribe lines and against thermo-mechanical stress caused by the metal-filled vias.

The vias are constructed so that they can be electrically connected to other chips or substrates, either vertically to form a three-dimensional stack, or horizontally to form a two-dimensional chain.

One embodiment of the invention is a semiconductor system including a chip and a workpiece. The chip has first contact pads near its edges and active components remote from its edges. The chip further has vias positioned between the pads and the respective edges; each vias has an insulating coat, a metal-filled core, and is connected to a pad. In addition, seals against microcracks and thermo-mechanical stress are located between the vias and the active components, and in certain embodiments also between the vias and the respective nearest edge. The workpiece may be a second semiconductor chip or a substrate; it has second contact pads matching the locations of the vias. When the workpiece is a second chip, it may have active components different from the components of the first chip. The chip is vertically stacked on the workpiece so that each second contact pad is aligned and in electrical contact with the corresponding via.

Another embodiment of the invention is a semiconductor system including two chips. Each chip has contact pads near its edges and active components remote from its edges. Each chip further has metal-filled vias contiguous with one edge, the metal cores at least partially exposed along the chip side. In addition, seals against microcracks and thermo-mechanical stress are located between the vias and the active components. The vias of the second chip are in locations matching the via locations of the first chip, and are contiguous with the chip edge; the metal cores are at least partially exposed along the chip side. Again, seals against microcracks and thermo-mechanical stress are located between the vias and the active components. The exposed vias of the first chip are aligned and in contact with the exposed vias of the second chip, whereby the first and the second chip form a horizontal chain.

Another embodiment of the invention is a method for fabricating a semiconductor system of vertically stacked chips or chip-substrate combinations. A semiconductor wafer with first and second surfaces is provided, which has a plurality of chips separated by scribe lines. Each chip has contact pads, metal-filled vias extending from the first to the second surface, and seals against microcracks and thermo-mechanical stress as described above. The chips are singulated from the wafer along the scribe lines, preferably by sawing. Metal bumps are attached to the second surface of each via, preferably by wire ball bonding. Workpieces such as substrates or second chips are provided, which have a third surface including second contact pads matching the locations of the vias. Each chip is then stacked vertically on a workpiece so that each via bump is aligned and in electrical contact with the respective second contact pad.

Yet another embodiment of the invention is a method for fabricating a horizontal chain of chips. Two semiconductor wafers have chips separated by scribe streets. The active components of the chips may be different. At least a portion of the vias of the first chip are contiguous with at least a first scribe street; at least a portion of the vias of the second chip are contiguous with at least a second scribe street in locations matching the locations of the first vias contiguous with the first scribe street. The chips are singulated from the wafers, thereby at least partially exposing the metal cores of the vias contiguous with the at least one scribe street. A chip from the second wafer and a chip from the first wafer are oriented so that the exposed metal cores of the second vias are aligned with the respective exposed metal cores of the first vias. The respective metal cores are then attached and electrically connected.

The technical advances represented by the invention, as well as the objects thereof, will become apparent from the following description of the preferred embodiments of the invention, when considered in conjunction with the accompanying drawings and the novel features set forth in the appended claims.

BRIEF DESCRIPTION OF THE DRAWINGS

FIGS. 1 and 3 show embodiments of the invention, wherein a semiconductor chip is structured to facilitate the assembly with a workpiece in order to create a stack.

FIGS. 4 to 9 display embodiments of the invention regarding arrangements of metal-filled vias and seal structures.

DETAILED DESCRIPTION OF THE PREFERRED EMBODIMENTS

Figure 1:
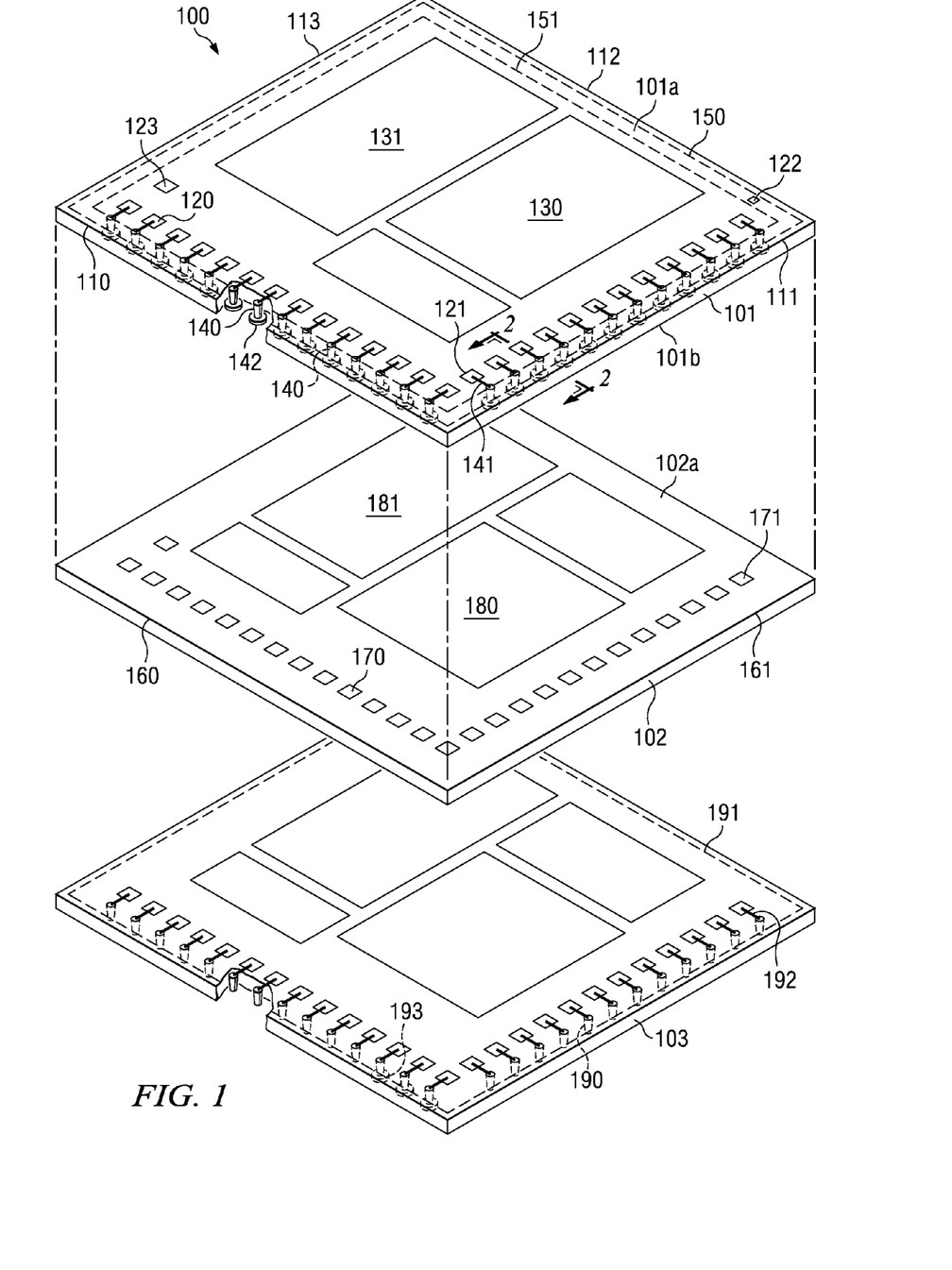
FIG. 1 depicts a schematic perspective view of two semiconductor chips to be assembled into a chip stack; the top chip exhibits features according to the invention in order to facilitate the stack assembly.

FIG. 1 depicts an embodiment of the invention; the schematic perspective view shows two semiconductor chips 101 and 102 to be assembled into a chip stack generally designated 100. The top chip 101 and the bottom chip 102 exhibit features according to the invention, which facilitate the stack assembly without the need for redesigning the circuitry of either chip. As a consequence, the assembly of the chip-stack product 100 creates a device, which combines the characteristics of existing chip 101 as well as existing chip 102 without spending the effort, time and cost to design the new device or to modify the circuitry of either chip.

Semiconductor chip 101 has edges 110, 111, 112, and 113; it further has first surface 101a and second surface 101b. First surface 101a includes first contact pads 120 near edge 110, contact pads 121 near edge 111, contact pads 122 near edge 112, and contact pads 123 near edge 113. Chip 101 has active components, such as integrated circuits 130 and 131, remote from the edges 110, 111, etc.

Figure 2:
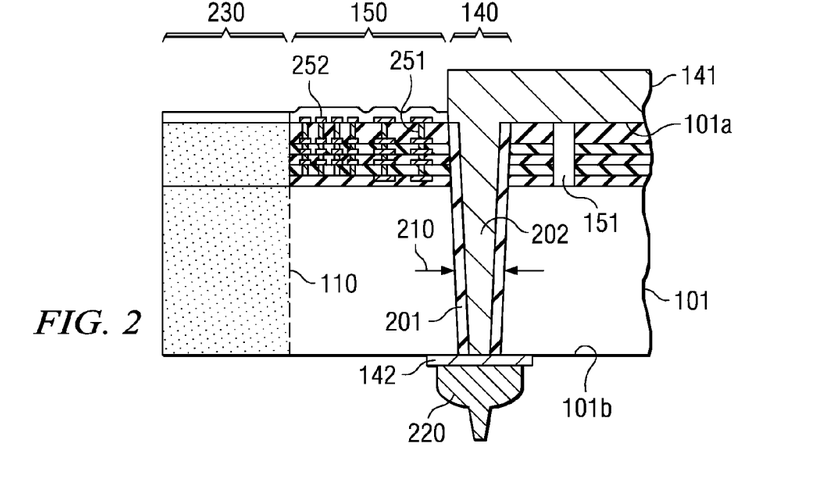
FIG. 2 shows a magnified cross section of a portion of the top chip in FIG. 1, illustrating features of a metal-filled through-via according to the invention for facilitating chip stack assemblies.

FIG. 1 further shows through-semiconductor-vias (TSVs) 140 extending from the first surface 101a to the second surface 101b of the semiconductor chip 101. A magnified cross section of a via 140 is illustrated in FIG. 2. The via has a diameter 210 with an opening of a circular cross section, or a geometrical cross section given by the crystalline orientations of the semiconductor. Preferred diameters are between about 3 and 50 µm. Since the amount of metal in the via core determines the size of the CTE difference to the semiconductor material, vias with small diameter are preferred. For silicon, its CTE dominates the metal CTE in vias with diameters smaller than about 30 µm. For a cylinder-shaped via, diameter 210 is constant over the via length. The wall of via 140 is covered by an insulating layer (coat) 201. The core of the via is filled with metal 202, preferably copper. On the first chip surface 101a, via 140 has a routing trace 141 (preferably copper) to a particular pad 121, and on the second chip surface 101b, via 140 may have a metal terminal 142 (preferably copper with a bondable surface) together with a metal bump 220, preferably fabricated as a gold ball (alternatively as a copper ball) by a wire ball bonding technique (see below).

Chip 101 further has seals against microcracks and against thermo-mechanical stress. In FIG. 1, these seals are schematically indicated by dots; in FIG. 2, an example is given for specific seal structures in a specific arrangement; and in FIGS. 4 through 13, a variety of preferred seal combinations is illustrated.

In FIGS. 1 and 2, the seal structures designated 150 are designed to minimize or even eliminate microcracks. Seals 150 are located between the vias 140 and the respective nearest chip edge (designated 110 in the example of FIGS. 1 and 2); the semiconductor region designated 230 is the scribe street and indicates material sacrificed by the scribing operation. Seals 150 operate to block microcracks in the semiconductor material; these microcracks are typically created during the chip singulation operation, when a rotating saw blade cuts through the scribe street 230. Even in an alternative scribing technique using lasers, microcracks are created.

A variety of metal structures 150 embedded in semiconductor adjacent to the scribe street have been developed and employed as effective microcrack seals. An example of a successful seal structure is described in U.S. Pat. No. 6,365,958, issued Apr. 2, 2002 and reproduced in FIG. 2. The seal structures extend along the chip edge (for example, 110 in FIG. 1) and penetrate from the surface into the semiconductor material as deep as the active components 130 etc. The structure includes at least one continuous barrier wall 251 adjacent the active components, combined with a sacrificial composite structure 252 between the wall 251 and scribe street 230. The composite structure has the ability to disperse the energy associated with crack propagation: A crack with sufficient energy to penetrate the composite structure will be transformed into a plurality of weaker cracks, none of which will be capable of penetrating the wall. The composite structure includes at least two grids of intersecting metal lines, connected by metal-filled vias, forming a three-dimensional network of metal distributed within a plurality of oxide insulation layers.

Further depicted in FIGS. 1 and 2, the seal structures designated 151 are designed to minimize or even eliminate thermo-mechanical stress. These stresses originate from the difference in the coefficients of thermal expansion (CTE) between the metal in the vias and the semiconductor material. As an example, the CTE of copper is about an order of magnitude higher than the CTE of silicon. During the temperature excursions in device operation or thermal testing, the CTE difference causes (compressive or tensile) stresses. A preferred seal is a trench extending from the chip surface 101a into the semiconductor material. Preferably, the trench is narrow so that it consumes only little semiconductor real estate, but deep enough to extend at least a significant portion of the active component depth. Preferential etches have been described in literature to etch trenches specific for semiconductor crystalline orientations. Dependent on the etching technique, the trenches may have triangular, rectangular, or other cross sections. The trenches operate to impede or even block stresses, which are caused by temperature cycling or operational temperature variation of the devices, or by mechanical compressive, tensile or shear forces.

Figure 3:
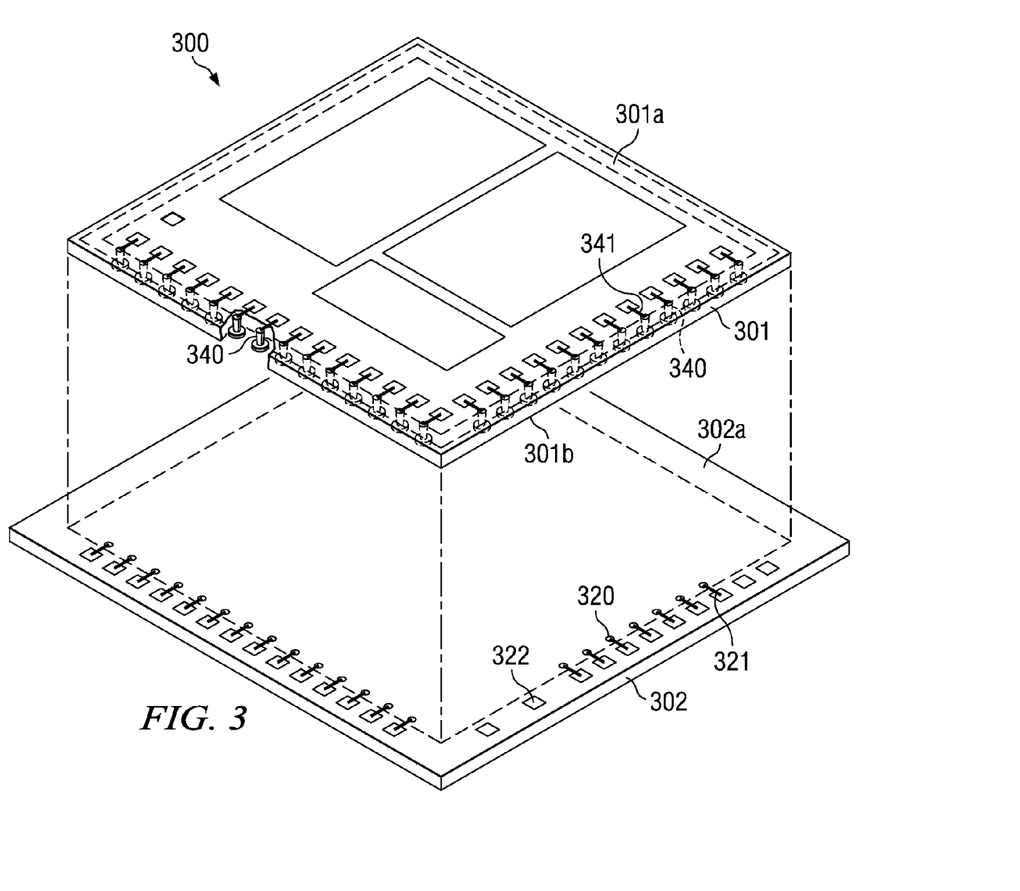
FIG. 3 depicts a schematic perspective view of a semiconductor chip and a substrate to be assembled into a stack; the chip exhibits features according to the invention in order to facilitate the stack assembly.

The embodiment of the invention further includes a workpiece with second contact pads matching the locations of the vias 140 of chip 101. The embodiment of FIG. 1 depicts the workpiece for the case that it is a second semiconductor chip, and FIG. 3 depicts the workpiece as an insulating substrate laminated with conductive traces. FIG. 1 actually includes two options for the second semiconductor chip:

In one option, the second chip, designated 102, has edges 160, 161, etc., a third surface 102a with second contact pads matching the locations of vias 140: Pads 170 near edge 160, pads 171 near edge 161, etc. Chip 102 has active components 180, 181, etc. remote from the edges. With pads 170, 171, etc. matching the locations of vias 140, chip 101 can be vertically stacked on chip 102 so that the third surface 102a faces the second surface 101b, and each second contact pad 170, 171, etc. is aligned and in electrical contact with the corresponding metal bump of via 140.

In another option, the second chip, designated 103, is fabricated analogous to chip 101; it has second vias 190 positioned between the second pads and the respective edges. Instead of the second pads matching the locations of the vias 140 of the first chip 101, the second vias 190 may match the locations of vias 140. In addition, seals 191 against microcracks are located between second vias 190 171, and the respective nearest edge, and seals against thermo-mechanical stress (not shown in chip 103) may be located between second vias 190 and the active components. As FIG. 1 shows, each second via 190 may have on the third surface a routing connection 192 to a respective second pad, and on the fourth surface a metal terminal 193 suitable for attaching a metal bump (similar to the bump illustrated in FIG. 2).

In a preferred arrangement, chip 101 may have a plurality of the vias 140 arrayed in regular rows parallel to the chip edges. In another preferred arrangement, chip 101 may have the vias arrayed in staggered locations. In that case, the chip may further have seals against thermo-mechanical stress located between the staggered vias.

FIG. 3 depicts another embodiment of the invention generally designated 300; the schematic perspective view shows a semiconductor chip 301 to be assembled on a substrate 302. Chip 301 has a first surface 301a and a second surface 301b and is fabricated analogous to chip 101 in FIG. 1. It exhibits electronic components such as integrated circuits with contact pads in the center portions of the chip, and metal-filled vias 340 close to the chip edges. Each via has a routing trace 341 to a contact pad and a metal bump (not shown in FIG. 3) to enable electrical contact to pads on substrate 302.

Substrate 301 may be made of an insulating material such as plastic or ceramic laminated with conductive traces. Substrate 302 has a third surface 302a including second contact pads 320; these pads match the locations of the vias 340 of chip 301. Each pad 320 is preferably connected by a conductive trace 321 to a pad 322, which preferably has a solderable surface in order to provide attachment to solder balls. Alternatively, pads 322 may have a bondable surface in order to provide attachment to wire bonds.

Chip 301 can be vertically stacked on substrate 302 so that third surface 302a faces the second surface 301b. Each second contact pad 320 is aligned and in electrical contact with the corresponding bumped via 320.

Figure 4:
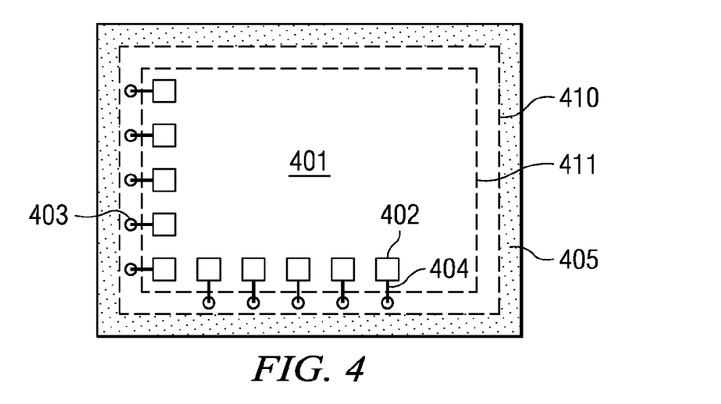
FIG. 4 shows a schematic top view of a semiconductor chip depicting an embodiment of the invention concerning the chip scribe streets and a certain arrangement of metal-filled vias, seals, and contact pads.
Figure 5:
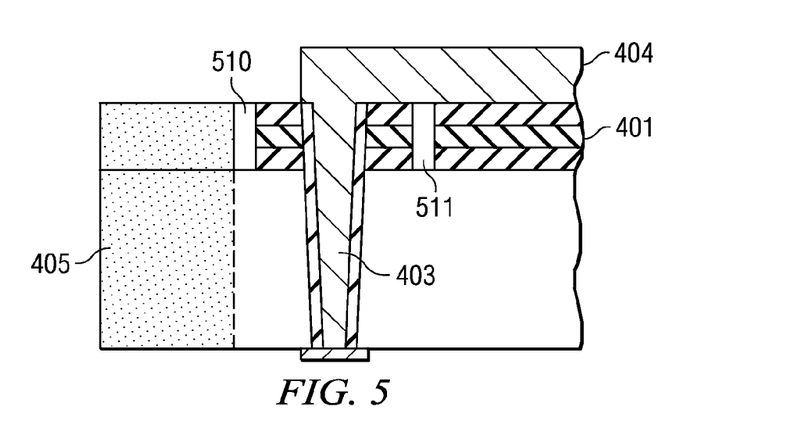
FIG. 5 is a schematic cross section of a portion of the chip in FIG. 4 near the scribe street, illustrating a metal-filled via and a certain arrangement of seal structures.
Figure 6:
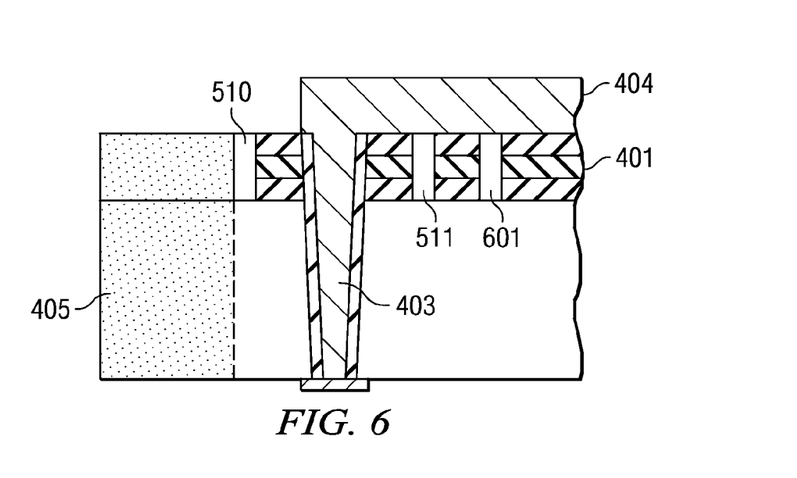
FIG. 6 is a schematic cross section of a portion of the chip in FIG. 4 near the scribe street, illustrating a metal-filled via and another arrangement of seal structures.

As pointed out, seals are commonly needed to protect the electronic components of chips from microcracks propagating inward from the chip sides created by the singulation process, and from thermo-mechanical stresses originating from the CTE mismatch between the via metal and the semiconductor material in temperature excursions. FIGS. 4 to 9 display various seal arrangements preferred by the embodiments of the invention. The cross sectional views of FIGS. 5 and 6 illustrate two seal arrangements for the chip shown in the top view of FIG. 4. The area 401 of the active components is remote from the dotted areas 405 reserved for the scribe streets. The components of the active area also have bond pads 402; each pad 402 is connected by trace 404 to a metal-filled via 403. In FIG. 4, vias 403 are arrayed in rows parallel to the scribe streets.

In FIG. 4, dotted line 410 indicates the microcrack seals 510 in FIGS. 5 and 6; these seals are shown in more detail in FIG. 2 as a three-dimensional network 150 of metal structures in insulating material. Actually, FIG. 2 may be considered a magnified and more complete representation of the seal arrangement of FIG. 5. Dotted line 411 indicates the stress-impeding trench seals 511 in FIGS. 5 and 6; these seals are shown in more detail in FIG. 2 as the groove 151 cutting from the chip surface into the multilayer metal/insulator structure of the active component area. In the embodiment of FIG. 6, additional trench seals 601 are implemented as protection of the circuitry to diminish the thermo-mechanical stress further. On the other hand, in some embodiments either the microcrack seals or the stress seals may not be needed.

Figure 7:
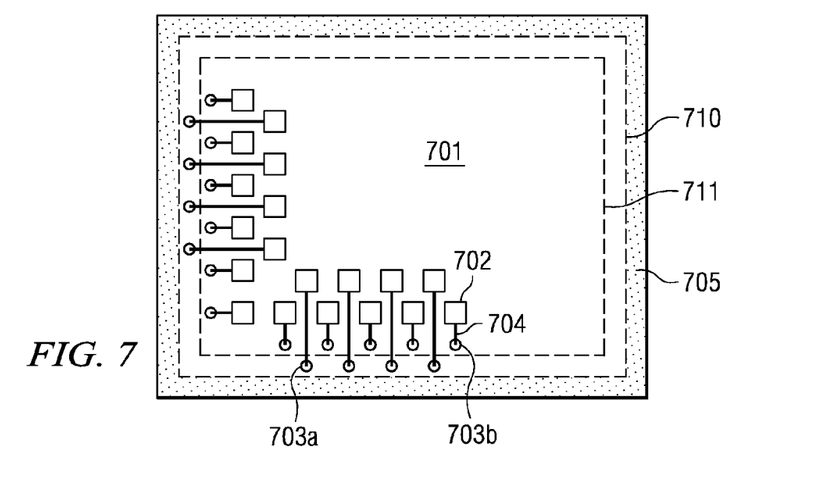
FIG. 7 shows a schematic top view of a semiconductor chip depicting another embodiment of the invention concerning the chip scribe streets and a certain arrangement of metal-filled vias, seals, and contact pads.
Figure 8:
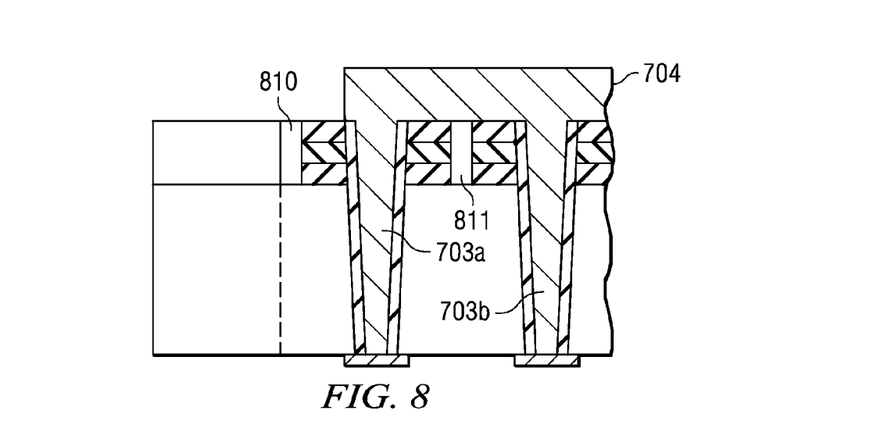
FIG. 8 is a schematic cross section of a portion of the chip in FIG. 7 near the scribe street, illustrating staggered arrangements of metal-filled vias and seal structures.
Figure 9:
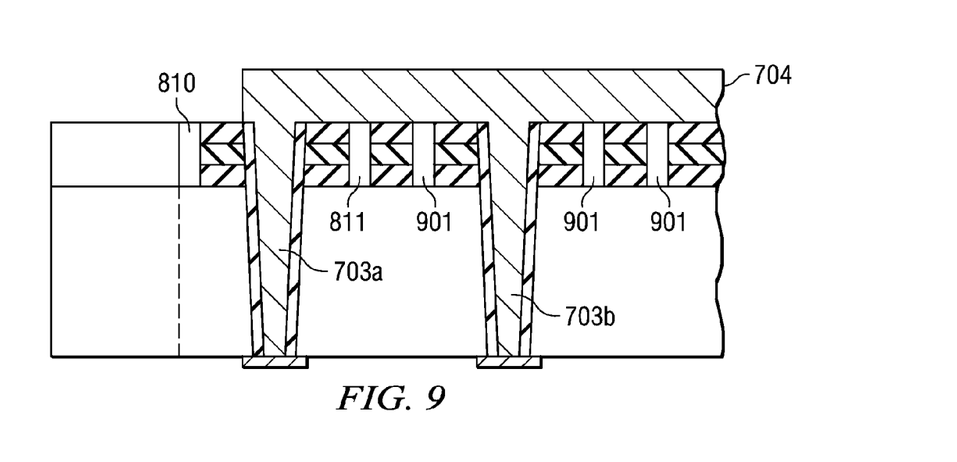
FIG. 9 is a schematic cross section of a portion of the chip in FIG. 7 near the scribe street, illustrating staggered arrangements of metal-filled vias and another arrangement of seal structures.

Another embodiment of the vias, seals, and bond pads is illustrated in FIGS. 7, 8, and 9. The cross sectional views of FIGS. 8 and 9 illustrate seal arrangements for the chip shown in the top view of FIG. 7. The chip area 701 of the active components has the bond pads 702. The dotted area reserved for the scribe street of the chip is designated 705. The plurality of metal-filled vias 703 is arrayed in rows parallel to the scribe streets and furthermore in staggered locations. In FIGS. 7, 8, and 9, vias in the row nearer to the scribe street are designated 703*a*, and vias in the row more remote from the scribe streets are designated 703*b*. In addition, the bond pads 702 are arrayed in rows parallel to the scribe streets and also in staggered locations. Each pad 702 is connected by trace 704 to a metal-filled via 703. In FIG. 7, dotted line 710 indicates the microcrack seals 810 in FIGS. 8 and 9; these seals are shown in more detail in FIG. 2 as a three-dimensional network 150 of metal structures in insulating material. Dotted line 711 indicates the stress-impeding trench seals 811 in FIGS. 8 and 9; these seals are shown in more detail in FIG. 2 as the groove 151 cutting from the chip surface into the multilayer metal/insulator structure of the active component area.

In the embodiment of FIG. 9, additional seals 901 (microcrack seals and stress seals) are implemented as protection of the circuitry to diminish the thermo-mechanical stress further. On the other hand, in some embodiments either the microcrack seals or the stress seals may not be needed.

Figure 10:
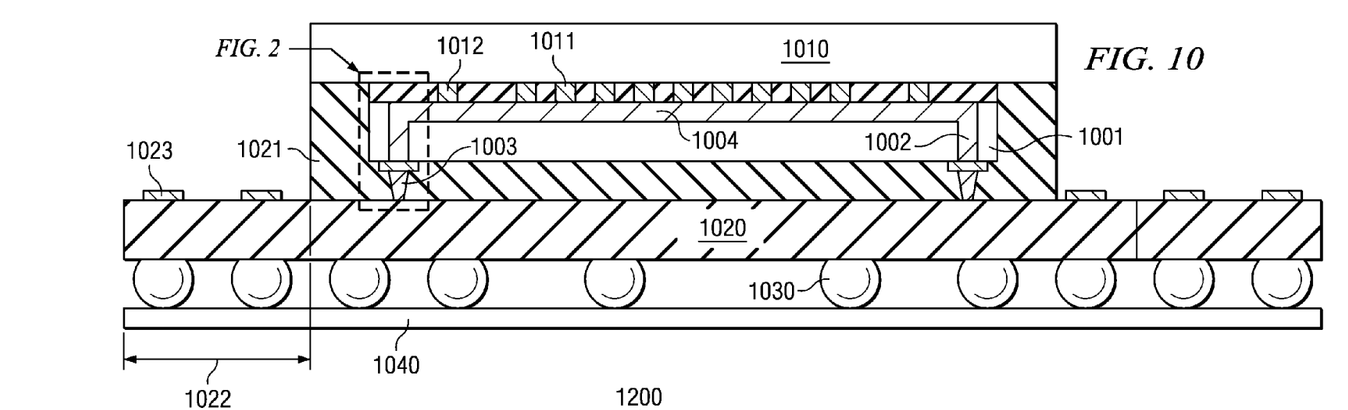
FIG. 10 illustrates a schematic cross section of a semiconductor package-on-package device enabled by an embodiment of the invention.
Figure 11:
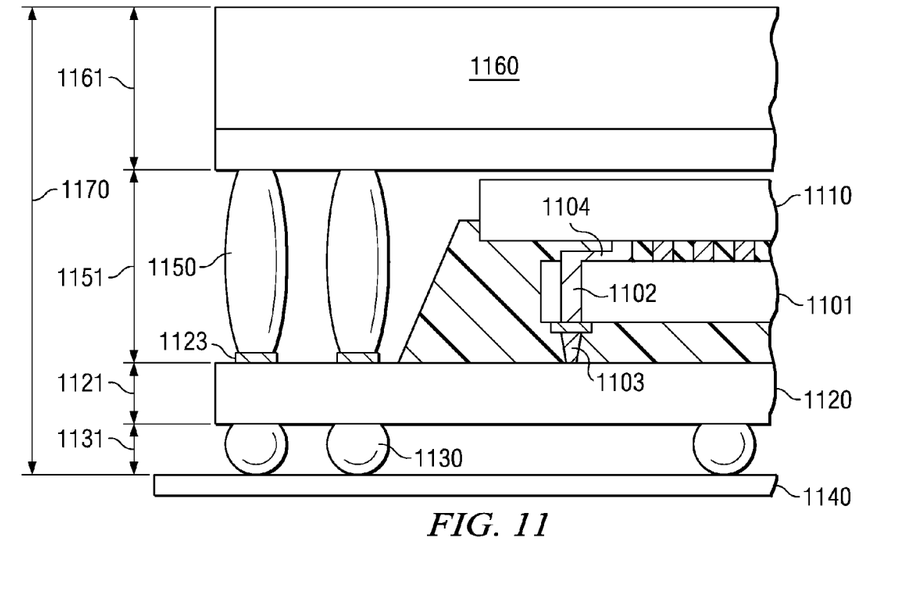
FIG. 11 illustrates a schematic cross section of a portion of another semiconductor package-On-package device enabled by an embodiment of the invention.

The full benefits of chips stacked by using metal-filled vias can be seen in products such as the package-on-substrate device of FIG. 10 or the package-on-package device of FIG. 11. In FIG. 10, a signal-processing chip 1001 has metal-filled vias 1002 in regions of chip 1001, which are not used for active components (such as peripheral chip regions along the chip edges). In addition, chip 1001 has seals (not shown in FIG. 10) against microcracks and thermo-mechanical stress near the vias. On the active surface of chip 1001 are redistribution lines 1004 (preferably made of copper or aluminum) with contact pads to attached memory chip 1010. On the passive surface of chip 1001 are metal bumps 1003 (preferably made of gold) attached to vias 1002.

Chip 1010 is attached to chip 1001 by metal bumps 1011 for signals and power, preferably made of gold or copper. In addition, some bumps 1012 may be added for balanced construction. It is preferred that chip 1010 does not need additional rerouting traces. After assembly of chips 1001 and 1010, the gaps between metal bumps 1011 may be underfilled with an adhesive polymer for redistribution of thermo-mechanical stress.

In FIG. 10, the bumps 1003 of the metal-filled vias 1002 are attached to substrate 1020. Preferably, substrate 1020 is made of insulating material such as polymers or ceramic, integral with conductive traces and contact pads for bumps 1003 and solder bodies 1030. After assembly of chip 1001 onto substrate 1020, the gaps between metal bumps 1003 may be underfilled with an adhesive polymer for redistribution of thermo-mechanical stress. In turn, solder bodies 1030 may be attached to external part 1040 (for example, a printed circuit board).

For many products, the contour of the assembled device is given by line 1021 in FIG. 10. It should be pointed out, though, that substrate 1020 may be configured to support further assembly of package-on-package devices. For this purpose, substrate 1020 may be extended by length 1022 to provide area for additional contact pads 1023, suitable for solder attachment of an additional package. An example of such package-on-package arrangement is shown in FIG. 11.

In FIG. 11, the metal-filled vias 1102 together with rerouting traces 1104 and metal bumps 1103 are employed to assemble chip 1101 with chip 1110 and with substrate 1120; both chips 1101 and 1110 may perform digital microprocessor or analog functions. Substrate 1120 has contact pads 1123 for solder connections 1150 to another package 1160, for instance a memory product. Substrate 1120 further has solder connections 1130 to external part 1140 (such as a printed circuit board). A technical advantage of this compact assembly, sought after, for example, by the market for hand-held products, is the resulting low overall thickness of the final product. The thickness of chips 1101 and 1110 can be kept to about 0.1 mm each; metal bump 1103 may be about 0.03 mm high. With package 1160 having a thickness 1161 of about 0.5 mm, substrate 1120 having a thickness 1121 of about 0.13 mm, solder connections 1150 having a height 1151 of about 0.25 mm, and solder connections 1130 having a height 1131 of about 0.12 mm, the overall product thickness 1170 amounts to approximately 1.0 mm.

Figure 12:
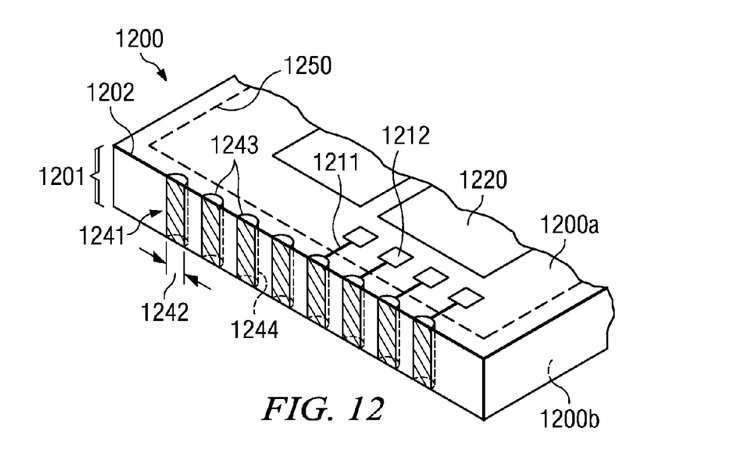
FIG. 12 depicts a schematic perspective view of a portion of a semiconductor chip with structures according to another embodiment of the invention to facilitate the assembly with another semiconductor chip in order to create a chain of chips.

Another embodiment of the invention is a horizontal chain of at least two semiconductor chips, which are attached to each other along respective small sides of their cuboids. FIG. 12 illustrates a first small side 1201 of a portion of a first semiconductor chip 1200, which has a first edge 1202 to the first side 1201. Chip 1200 further has a first surface 1200*a* and a second surface 1200*b*; the first surface 1200*a* includes first contact pads 1212 near first edge 1202 and active components 1220 remote from the first edge.

A plurality of first vias 1241 is contiguous with first edge 1202. The vias have a diameter 1242, an insulating coat 1243 and a metal-filled core 1244. As FIG. 12 shows, the core 1244 is at least partially exposed along the first side 1201 (the scribing process, which causes the exposure, is described below). Each first via 1241 has on the first surface 1200*a* a routing trace 1211 to one first pad 1212.

Indicated by dashed line 1250 in FIG. 12, seals against microcracks and seals against thermo-mechanical stress are located between the first vias 1241 and the active components 1220 of the first chip 1200.

Figure 13:
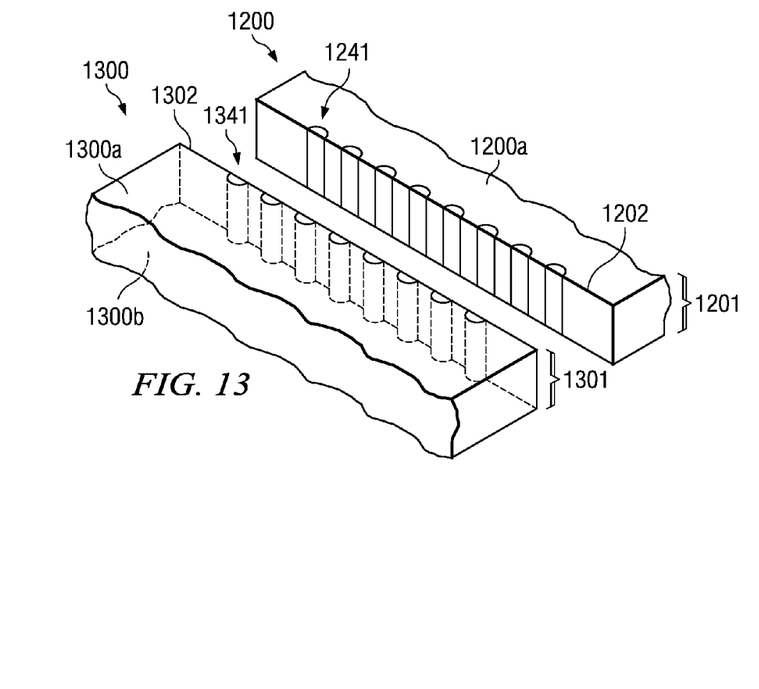
FIG. 13 illustrates a schematic perspective view of a portion of two semiconductor chips with embodiments of the invention to facilitate the assembly of two chips in order to create a chain of chips.

FIG. 13 indicates in simplified manner a portion of first semiconductor chip 1200 and a portion of a second semiconductor chip 1300. This second chip 1300 has a second edge 1302 to a second side 1301, a third surface 1300*a* and a fourth surface 1300*b*. In analogy to first chip 1200, but for clarity not shown in FIG. 13, the third surface 1300*a* includes second contact pads near the second edge 1302 and active components remote from the second edge 1302.

A plurality of second vias 1341 is contiguous with second edge 1302. The vias 1341 are in locations matching the locations of the first vias 1241 at the first edge 1202. In analogy to vias 1202, the core of vias 1302 is at least partially exposed along the second side 13011. Also in analogy the chip 1200, each second via 1341 has on the third surface 1300*a* a routing trace (for clarity not shown in FIG. 13) to one second pad. Also not shown for clarity are seals against microcracks and seals against thermo-mechanical stress, which are located between the second vias 1341 and the active components of the second chip.

In order to form the horizontal chain between chip 1200 and chip 1300, the second side 1301 faces the first side 1201, as depicted in FIG. 13. Having the distance between the chip sides 1201 and 1301 reduced to zero, the second side 1301 is attached to the first side 1201 so that each second via 1341 is aligned and in electrical contact with the respective first via 1241, preferably using solder or electrically conductive adhesive.

Another embodiment of the invention is a method for fabricating a stack of a semiconductor chip and a workpiece, which may be another semiconductor chip or a substrate. The method starts with providing a semiconductor wafer fabricated with a plurality of electronic components ("chips") such as integrated circuits; the wafer has a first and a second surface. The first surface includes the plurality of chips laid out so that they are separated by semiconductor regions reserved to be sacrificed as scribe streets for separating the chips. Each chip has on the first surface active components remote from the scribe streets, first contact pads near the scribe streets, and vias between the first pads and the scribe streets.

The vias have a diameter, an insulating coat, a metal-filled core and, on the first surface, a routing trace to one pad; preferably each via also has metallic terminal on the second surface. The via may be made by chemical etching, laser, or plasma.

Each chip further has seals against microcracks located between the vias and the respective nearest scribe street, and seals against thermo-mechanical stress located between the vias and the active components. The seals against microcracks comprise three-dimensional sacrificial structures of alternating metal and insulator regions; the seals against thermo-mechanical stress comprise grooves or trenches extending from the chip surface into the semiconductor material.

In the next process step, the chips are singulated from the wafer along the scribe streets. The preferred singulation technique is a rotating sapphire saw cutting through the wafer along the scribe streets. Any microcracks in the semiconductor material adjacent to the scribe streets, which may be created by the sawing process, are stopped by seal structures made by a three-dimensional metal/insulator network.

In addition to the metal/insulator seals against microcracks between the vias and the scribe streets, further seals against microcracks may be located between the vias and the active components.

A metal bump is then attached to the second surface of each via, preferably a bump of gold or copper. The preferred attachment method is a modified wire ball bonding technique.

Next, a plurality of workpieces is provided. The workpieces have a third surface, which includes second contact pads matching the locations of the vias of the chips. The workpieces may be insulating substrates laminated with conductive lines. Alternatively, the workpieces may be second semiconductor chips; in this case, the workpiece contact pads may coincide with metal-filled vias through the second chips.

Specifically, when the workpieces are semiconductor chips, each chip has edges and a third and a fourth surface; the third surface includes second contact pads near the respective edges, and active components remote from the edges; the second chip has second vias positioned between the second pads and the respective edges in locations matching the locations of the first chip vias; and further seals against microcracks located between the second vias and the respective nearest edge, and seals against thermo-mechanical stress located between the second vias and the active components.

In the next process step, a chip is selected and stacked vertically on a workpiece so that the second surface faces the third surface, and each via bump is aligned and in electrical contact with the respective second contact pad. The bumps of the vias are metallurgically attached to the second pads, preferably using a solder reflow technique, or alternatively using a conductive adhesive.

Another embodiment of the invention is a method for fabricating a horizontal chain of semiconductor chips. The method starts with providing a first semiconductor wafer with a first and a second surface; the first surface includes a plurality of chips separated by scribe streets. Each chip has on the first surface contact pads near the scribe streets, and active components remote from the scribe streets. The chip further has first vias with a diameter, an insulating coat, a metal-filled core, and on the first surface a routing trace to one pad. At least a portion of the first vias is contiguous with at least a first scribe street. In addition, each chip has seals against thermo-mechanical stress located between the first vias and the active components.

In the next process step, the chips are singulated from the first wafer along the scribe streets. The preferred method for cutting the semiconductor material uses a rotating saw. This process step exposes, at least partially, the metal cores of the first vias, which are contiguous with at least one scribe street.

Next, a second semiconductor wafer is provided, which has a third and a fourth surface. The third surface includes a plurality of chips separated by scribe streets; each chip has on the third surface contact pads near the scribe streets, and active components remote from the scribe streets.

Each chip has further second vias with a diameter, an insulating coat, a metal-filled core and, on the third surface, a routing trace to one pad. At least a portion of the second vias are contiguous with at least a second scribe street in locations matching the locations of the first vias contiguous with the first scribe street. Each chip further has seals against thermo-mechanical stress located between the second vias and the active components.

In the next process step, the chips are singulated from the second wafer along the scribe streets. The preferred method for cutting the semiconductor material uses a rotating saw. This process step exposes, at least partially, the metal cores of the second vias, which are contiguous with at least one scribe street.

Then, a chip from the second wafer and a chip from the first wafer are selected; they are oriented against each other so that the exposed metal cores of the second vias are aligned with the respective exposed metal cores of the first vias. The respective metal cores of the chips are metallurgically attached and electrically connected, preferably using a solder reflow technique, or alternatively using a conductive adhesive. In this fashion, a horizontal chain of the chips is created, linked by the attached via metal cores.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, for certain scribe seals configurations, two, three, four or more seal structures may be needed. In addition, the combination of microcrack and groove seals may be modified. As another example, the metal-filled vias may be arrayed linearly or in any orderly arrangement. As another example, in addition to the peripheral chip regions, the vias may be placed in any non-active semiconductor region of the chip.

It is therefore intended that the appended claims encompass any such modifications or embodiments.

What is claimed:

1. A semiconductor apparatus comprising:
    a semiconductor chip having edges, a first surface and a second surface, the first surface including first contact pads near the respective edges and active components remote from the edges;
    vias extending from the first to the second surface and positioned between the first pads and the respective edges, the vias having a diameter, an insulating coat, and a metal-filled core; each via having on the first surface a routing trace to one pad, and on the second surface a metal bump;
        seals against microcracks located between the vias and the respective nearest edge, and seals against thermo-mechanical stress located between the vias and the active components;
        a workpiece having a third surface including second contact pads matching the locations of the vias; and
        the chip vertically stacked on the workpiece so that the third surface faces the second surface and each second contact pad is aligned and in electrical contact with the corresponding via bump.

2. The apparatus according to claim 1 wherein the workpiece is an insulating substrate laminated with conductive traces.

3. The apparatus according to claim 1 wherein the workpiece is a second semiconductor chip.

4. The apparatus according to claim 3 wherein the second chip has edges, a third and a fourth surface, the third surface including second contact pads near the respective edges and active components remote from the edges, the second chip further having second vias positioned between the second pads and the respective edges in locations matching the locations of the first chip vias, and seals against microcracks located between the second vias and the respective nearest edge, and seals against thermo-mechanical stress located between the second vias and the active components.

5. The apparatus according to claim 4 wherein each second vias has on the third surface a routing connection to one second pad, and on the fourth surface a metal terminal suitable for attaching a metal bump.

6. The apparatus according to claim 1 wherein the chips further have seals against microcracks located between the vias and the respective nearest edge.

7. The apparatus according to claim 1, wherein a seal against microcracks includes sacrificial structures of alternating metal and insulator regions.

8. The apparatus according to claim 1, wherein a seal against thermo-mechanical stress includes trenches extending from the chip surface into the semiconductor material.

9. The apparatus according to claim 1 wherein the chip has a plurality of the vias arrayed in rows parallel to a chip edge.

10. The apparatus according to claim 1 wherein the vias are arrayed in staggered locations.

11. The apparatus according to claim 10 wherein the chip further has seals against thermomechanical stress located between the staggered vias.

12. The apparatus according to claim 1 wherein the diameters of the vias are between about 3 and 50 µm.

13. The apparatus according to claim 1 wherein the metal filling the core of the vias is copper.

14. The apparatus according to claim 1 wherein the metal bump on the second surface of the vias is selected from a group including gold, copper, palladium, and nickel.

15. A semiconductor apparatus comprising:
    a first semiconductor chip having a first edge to a first side, a first surface and a second surface, the first surface including first contact pads near the first edge and active components remote from the first edge;
    first vias contiguous with the first edge, the vias having a diameter, an insulating coat and a metal-filled core, the core at least partially exposed along the first side; each first via having on the first surface a routing trace to one first pad;
    seals against microcracks and thermo-mechanical stress located between the first vias and the active components of the first chip;
    a second semiconductor chip having a second edge to a second side, a third surface and a fourth surface, the third surface including second contact pads near the second edge and active components remote from the second edge;
    second vias contiguous with the second edge, the vias in locations matching the locations of the first vias at the first edge, the core at least partially exposed along the second side; each second via having on the third surface a routing trace to one second pad;
    seals against microcracks and thermo-mechanical stress, the seals located between the second vias and the active components of the second chip; and
    the second side attached to the first side so that each second via is aligned and in electrical contact with the respective first via, whereby the first and the second chip form a horizontal chain.

16. A method for fabricating a semiconductor apparatus comprising the steps of:
    providing a semiconductor wafer having a first and a second surface, the first surface including a plurality of chips separated by scribe streets;
        each chip having on the first surface active components remote from the scribe streets, first contact pads near the scribe streets, and vias between the first pads and the scribe streets, the vias having a diameter, an insulating coat, a metal-filled core and, on the first surface, a routing trace to one pad;
        each chip further having seals against microcracks located between the vias and the respective nearest scribe street, and seals against thermo-mechanical stress located between the vias and the active components;
    singulating the chips from the wafer along the scribe streets;
    attaching a metal bump to the second surface of each via;
    providing a plurality of workpieces having a third surface including second contact pads matching the locations of the vias;
    stacking each chip vertically on a workpiece so that the second surface faces the third surface and each via bump is aligned and in electrical contact with the respective second contact pad; and
    attaching the bumps to the second pads metallurgically.

17. The method according to claim 16 wherein the workpiece is an insulating substrate laminated with conductive lines.

18. The method according to claim 16 wherein the workpiece is a second semiconductor chip.

19. The method according to claim 18 wherein the second chip has edges, a third and a fourth surface, the third surface including second contact pads near the respective edges and active components remote from the edges; the second chip further having second vias positioned between the second pads and the respective edges in locations matching the locations of the first chip vias; and further seals against microcracks located between the second vias and the respective nearest edge, and seals against thermo-mechanical stress located between the second vias and the active components.

20. The method according to claim 16, wherein the chips further have seals against microcracks located between the vias and the active components.

21. The method according to claim 16, wherein a seal against microcracks includes sacrificial structures of alternating metal and insulator regions.

22. The method according to claim 16, wherein a seal against thermo-mechanical stress includes trenches extending from the chip surface into the semiconductor material.

23. The method according to claim 16 wherein the step of singulating the chips includes a sawing technique.

24. The method according to claim 16 wherein the step of attaching metal bumps includes a modified wire ball bonding technique.

25. The method according to claim 16 wherein the step of metallurgically attaching includes a solder reflow technique.

26. A method for fabricating a semiconductor apparatus comprising the steps of:
   providing a first semiconductor wafer having a first and a second surface, the first surface including a plurality of chips separated by scribe streets;
      each chip having on the first surface contact pads near the scribe streets, and active components remote from the scribe streets; first vias having a diameter, an insulating coat, a metal-filled core, and on the first surface a routing trace to one pad; at least a portion of the first vias contiguous with at least a first scribe street;
      each chip having seals against thermo-mechanical stress located between the first vias and the active components;
   singulating the chips from the first wafer along the scribe streets, thereby at least partially exposing the metal cores of the first vias contiguous with the at least one scribe street;
   providing a second semiconductor wafer having a third and a fourth surface, the third surface including a plurality of chips separated by scribe streets;
      each chip having on the third surface contact pads near the scribe streets, and active components remote from the scribe streets; further second vias having a diameter, an insulating coat, a metal-filled core and, on the third surface, a routing trace to one pad, at least a portion of the second vias contiguous with at least a second scribe street in locations matching the locations of the first vias contiguous with the first scribe street;
      each chip further having seals against thermo-mechanical stress located between the second vias and the active components;
   singulating the chips from the second wafer along the scribe streets, thereby at least partially exposing the metal cores of the second vias contiguous with the at least one scribe street;
   orienting a chip from the second wafer and a chip from the first wafer so that the exposed metal cores of the second vias are aligned with the respective exposed metal cores of the first vias;
   attaching and electrically connecting the respective metal cores to form a horizontal chain of the chips.

* * * * *